(12) United States Patent
Shen et al.

(10) Patent No.: US 12,317,044 B2
(45) Date of Patent: May 27, 2025

(54) MEMS PIEZOELECTRIC SPEAKER

(71) Applicant: AAC Kaitai Technologies (Wuhan) CO., LTD, Hubei (CN)

(72) Inventors: Yu Shen, Shenzhen (CN); Yiwei Zhou, Shenzhen (CN); Qiang Dan, Shenzhen (CN); Yang Li, Shenzhen (CN)

(73) Assignee: AAC Kaital Technologies (Wuhan) CO., LTD, Wuhan (CN)

( * ) Notice: Subject to any disclaimer, the term of this patent is extended or adjusted under 35 U.S.C. 154(b) by 0 days.

(21) Appl. No.: 17/919,534

(22) PCT Filed: Jul. 20, 2022

(86) PCT No.: PCT/CN2022/106847
§ 371 (c)(1),
(2) Date: Oct. 18, 2022

(87) PCT Pub. No.: WO2023/245789
PCT Pub. Date: Dec. 28, 2023

(65) Prior Publication Data
US 2025/0126409 A1 Apr. 17, 2025

(30) Foreign Application Priority Data
Jun. 21, 2022 (CN) .......................... 202221574278.6

(51) Int. Cl.
*H04R 7/20* (2006.01)
*H04R 7/06* (2006.01)
*H04R 17/10* (2006.01)

(52) U.S. Cl.
CPC ................ *H04R 7/20* (2013.01); *H04R 7/06* (2013.01); *H04R 17/10* (2013.01); *H04R 2307/207* (2013.01)

(58) Field of Classification Search
CPC ........ H04R 7/06; H04R 7/08; H04R 7/20–26; H04R 17/10; H04R 2307/207
See application file for complete search history.

(56) References Cited

U.S. PATENT DOCUMENTS 10,999,684 B1 * 5/2021 Wan ........................ H04R 17/02
2020/0382876 A1 * 12/2020 Cerini .................... H04R 17/02
(Continued)

OTHER PUBLICATIONS

Author: Yifei Ma, Yao Lu, Ning Deng, Qincheng Zheng, Ke Cao, Haopu Wang, Huikai Xie, Date: Apr. 16, 2023 Title: A PZT MEMS loudspeaker with a quasi-closed diaphragm, Publisher: Sensors and Actuators A: Physical, vol. 358 (Year: 2023).*

*Primary Examiner* — Fan S Tsang
*Assistant Examiner* — Tyler Michael Liebgott
(74) *Attorney, Agent, or Firm* — Wiersch Law Group

(57) ABSTRACT

The present invention provides a MEMS piezoelectric speaker including a substrate with a back cavity, a diaphragm, a capacitive system and a flexible film. The diaphragm includes a fixed end, a suspended end. Adjacent suspended ends are at least partially spaced to form a slit. The suspended end includes a support section and a piezoelectric section. Along the thickness direction of the MEMS piezoelectric speaker, a flexible film is at least partially spaced from the diaphragm and the flexible film is spaced from the substrate. This design can improve the sound pressure level of the MEMS piezoelectric speaker in the middle and high frequency, and improve the acoustic performance of the MEMS piezoelectric speaker.

10 Claims, 6 Drawing Sheets

(56) References Cited

U.S. PATENT DOCUMENTS

| | | | |
|---|---|---|---|
| 2020/0389735 A1* | 12/2020 | Yu | H01F 7/081 |
| 2021/0051409 A1* | 2/2021 | Duan | B81B 3/007 |
| 2022/0417671 A1* | 12/2022 | Dan | B81B 3/0037 |

* cited by examiner

B-B

C-C

MEMS PIEZOELECTRIC SPEAKER

FIELD OF THE PRESENT DISCLOSURE

The present invention relates to the field of electro-acoustic transducers, in particular to a MEMS piezoelectric speaker.

DESCRIPTION OF RELATED ART

MEMS (micro-electro-mechanical system) piezoelectric actuators, especially MEMS piezoelectric speakers, can be used as one of the main components of mobile terminals such as mobile phones. It is mainly used to convert electric signals into sound signals, which is the realization of human-computer interaction interface. key.

The related MEMS piezoelectric actuator usually includes a substrate, a diaphragm fixed on the substrate and a piezoelectric functional layer placed on the diaphragm, the piezoelectric functional layer deforms after being energized, and the charged diaphragm vibrates and emits sound. The diaphragm of the MEMS piezoelectric speaker in the related art is limited by the deformability of the driver, so the acoustic performance of the MEMS piezoelectric speaker cannot be further improved.

Therefore, it is necessary to provide a new MEMS piezoelectric speaker to solve the above technical problems.

SUMMARY OF THE PRESENT INVENTION

The purpose of the present invention is to provide a MEMS piezoelectric speaker to be able to solve problem that diaphragm of the MEMS piezoelectric speaker in the related art is limited by the deformability of the driver, and the acoustic performance of the MEMS piezoelectric speaker cannot be further improved.

For achieving the object mentioned above, the present invention provides a MEMS piezoelectric speaker including:

- a substrate with a back cavity;
- a diaphragm fixed to the substrate, having a fixed end fixed to the substrate, a plurality of suspended ends extending from the fixed end and suspended above the back cavity; a slit being formed between two adjacent suspended ends;
- an accommodation space communicating with the slit formed by spaced ends of the plurality of suspended ends away from the fixed end;
- a capacitive system fixed to a side of the diaphragm away from the substrate; wherein
- the suspended end includes a support section connected to the fixed end and a piezoelectric section connected to the support section away from the fixed end;
- the capacitive system includes a plurality of piezoelectric structures corresponding to the suspended end;
- each of the piezoelectric structures includes a first electrode layer, a piezoelectric layer and a second electrode layer that is stacked in order on the diaphragm and at least completely covers the piezoelectric section;
- a projection of the second electrode layer along a thickness direction of the MEMS piezoelectric speaker covers only the piezoelectric section of the diaphragm;
- an overlapping portion of the first electrode layer and the piezoelectric layer and the second electrode layer along the thickness direction of the MEMS piezoelectric speaker together form a piezoelectric functional area;

the MEMS piezoelectric speaker further includes a flexible film locating on a side of the capacitive system away from the back cavity and at least completely covering the slit; the flexible film is located on a different plane from the diaphragm; the flexible film is at least partially spaced from the diaphragm along the thickness direction of the MEMS piezoelectric speaker and the flexible film is spaced from the substrate.

Further, the projections of the first electrode layer and the piezoelectric layer along the thickness direction of the MEMS piezoelectric speaker both cover only the piezoelectric section of the diaphragm; or the projections of the first electrode layer and the piezoelectric layer along the thickness direction of the MEMS piezoelectric speaker both cover the fixed end and the suspended end of the diaphragm at the same time; or the projection of the first electrode layer along the thickness direction of the MEMS piezoelectric speaker covers the fixed end and the suspended end of the diaphragm; the projections of the piezoelectric layer and the second electrode layer along the thickness direction of the MEMS piezoelectric speaker covers only the piezoelectric section of the diaphragm.

Further, when the projection of the piezoelectric layer along the thickness direction of the MEMS piezoelectric speaker covers only the piezoelectric section of the diaphragm, the slit is only formed between the adjacent piezoelectric sections; the adjacent support sections of the suspended ends are connected to each other to form an integrated structure which acts as a support area to connect the piezoelectric functional area and the substrate.

Further, when the projections of the first electrode layer and the piezoelectric layer along the thickness direction of the MEMS piezoelectric speaker both cover the fixed end and the suspended end of the diaphragm at the same time, the slit extends to the inner perimeter of the substrate and completely separates the adjacent suspended ends Further, the diaphragm further includes a connection end connecting each of the suspended ends; the connection end is accommodated in the accommodation space; the connection end includes a first connection element connected to each of the suspended ends; each of the suspended ends is arranged around the first connection element.

Further, the connection end further includes a second connection element with one end connected to the suspended end and the other end connected to the first connection element; at least one second connection element is arranged between each of the suspended end and the first connection element.

Further, the MEMS piezoelectric speaker includes a weight fixed to the first connection element and accommodated in the back cavity.

Further, the Young's Modulus of the flexible film is smaller than the Young's Modulus of the diaphragm.

The MEMS piezoelectric speaker further includes a connection assembly fixed to a side of the connection end away from the substrate; the connection assembly includes a plurality of sub-connection elements stacked in sequence along the thickness direction of the MEMS piezoelectric speaker; the sub-connection element includes a first sub-connection element connecting the first electrode layers of a plurality of the piezoelectric structure, a second sub-connection element connected to piezoelectric layer, and a third sub-connection element connected to the second electrode layer.

Further, the first sub-connection element and the first electrode layer are integrated; the second sub-connection element and the piezoelectric layer are integrated; the third sub-connection element and the second electrode layer are integrated.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

Figure 1:
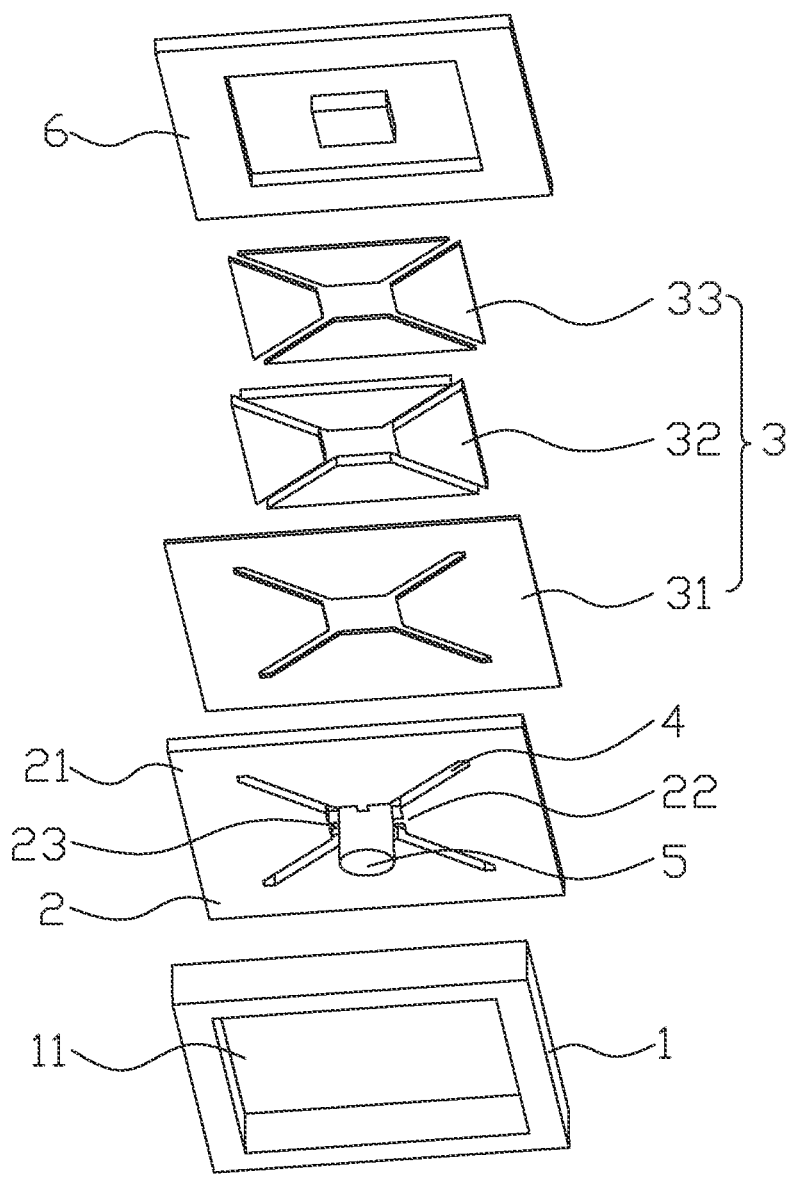
FIG. 1 is an exploded view of a MEMS piezoelectric speaker in accordance with a first embodiment of the present invention.
Figure 2:
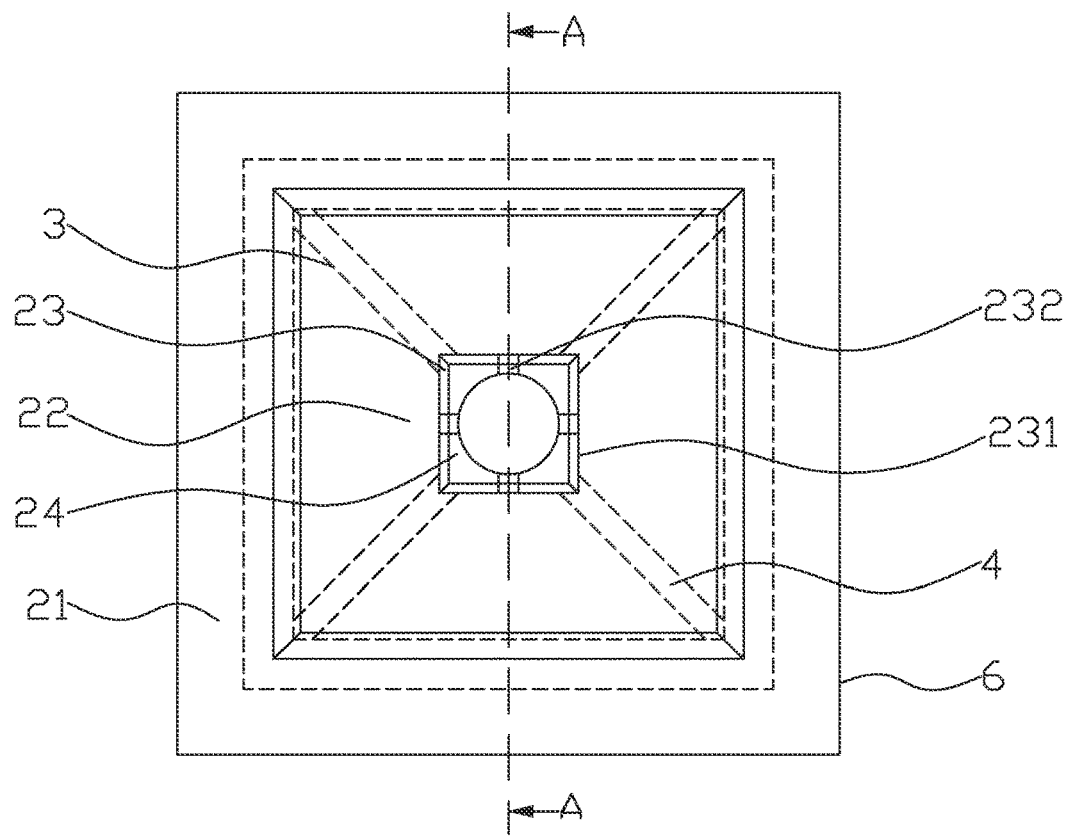
FIG. 2 is a top view of the MEMS piezoelectric speaker.
Figure 3:
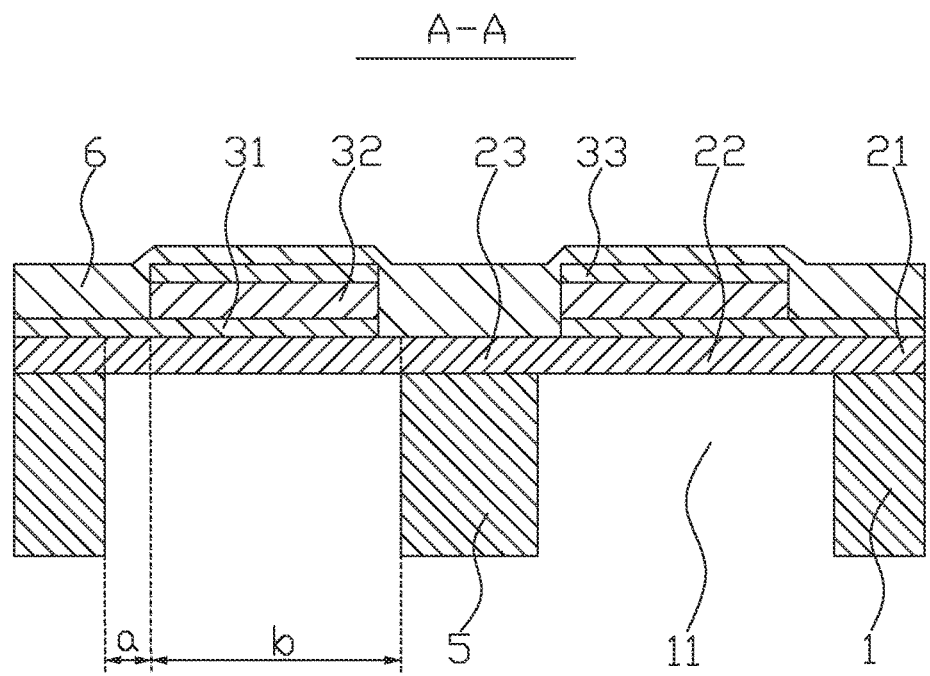
FIG. 3 is a cross-sectional view of the MEMS piezoelectric speaker taken along line AA in FIG. 2.

Referring to FIGS. 1-3, this embodiment provides a MEMS piezoelectric speaker including a substrate 1 with a back cavity 11, a diaphragm 2 fixed to the substrate 1, a capacitive system fixed to the side of the diaphragm 2 away from the substrate 1. The diaphragm 2 includes a fixed end 21 fixed to the substrate 1, a number of suspended ends 22 extending from the fixed end 21 and suspended above the back cavity 11, a connection end 23 connecting each of the suspended end 22. The adjacent suspended ends 22 are at least partially spaced to form a slit 4. The end parts of a number of suspended ends 22 away from the fixed end 21 are spaced to form an accommodation space 24 connected with the slit 4. The connection end 23 is contained in the accommodation space 24. The suspended end 22 includes a support section a connected to the fixed end 21 and a piezoelectric section b attached to the side of the support section a away from the fixed end 21. The capacitive system includes a number of the piezoelectric structures 3 corresponding to the suspended end 22. Each piezoelectric structure 3 includes a first electrode layer 31, a piezoelectric layer 32 and a second electrode layer 33 that are sequentially stacked on the diaphragm 2 and at least completely cover the piezoelectric section b. The projection of the second electrode layer 33 along the thickness direction of the MEMS piezoelectric speaker only covers the piezoelectric section b of the diaphragm 2. The overlapping part of the first electrode layer 31 and the piezoelectric layer 32 and the second electrode layer 33 along thickness direction of the MEMS piezoelectric speaker together form a piezoelectric functional area.

It can be understood that after the piezoelectric structure 3 is powered on, it drives the diaphragm 2 to vibrate to realize the sounding of the MEMS piezoelectric speaker. Because the projection of the second electrode layer 33 along the thickness direction of the MEMS piezoelectric speaker only covers the piezoelectric section b of the diaphragm 2, and the overlapping parts of the first electrode layer 31, the piezoelectric layer 32 and the second electrode layer 33 along thickness direction of the MEMS piezoelectric speaker together form a piezoelectric functional area. Therefore, the deformation of the piezoelectric structure 3 drives the piezoelectric section b below it to vibrate, and at the same time drives the support section a to vibrate, and the support section a is passively driven. Compared with the speaker in the prior art, this design can significantly improve the sound pressure level of the medium and high frequency of MEMS piezoelectric speaker, and then improve the acoustic performance of the MEMS piezoelectric speaker.

The substrate 1 can be a rectangular block with a rectangular back cavity 11. The fixed end 21 of the diaphragm 2 can be stacked and fixed on the four edges of the substrate 1. Each edge of the fixed end 21 is connected to a suspended end 22. Four suspended ends 22 are all connected to the connection end 23, and the four suspended ends 22 are arranged around the connection end 23 being a center at equal angular intervals. Each of the suspended end 22 is provided with a piezoelectric structure 3, which makes the vibration more stable after the diaphragm 2 is driven by the piezoelectric structure 3. It should be understood that in the piezoelectric structure 3, the first electrode layer 31 and the piezoelectric layer 32 are arranged in different ways on the diaphragm 2, and the positions of the slits 4 correspondingly formed are also different.

A projection of the first electrode layer 31 along a thickness direction of the MEMS piezoelectric speaker covers the fixed end 21 and the suspended end 22 of the diaphragm 2. The projections of the piezoelectric layer 32 and the second electrode layer along the thickness direction of the MEMS piezoelectric speaker both cover only the piezoelectric section b of the diaphragm 2. The slit 4 is formed only between adjacent piezoelectric sections b. The adjacent support sections a of each suspended end 22 are connected to each other to form an integrated structure as a support area to connect the piezoelectric functional area and the substrate 1. The flexible film 6 is placed on the side of the capacitive system away from the substrate 1, and the flexible film 6 covers the diaphragm 2 and piezoelectric structure 3 and is spaced from the substrate 1.

Specifically, the shapes and areas of the piezoelectric layer 32 and the second electrode layer 33 are the same as those of the piezoelectric section b. The piezoelectric layer 32 and the second electrode layer 33 cover part of the upper area of the back cavity 11. The first electrode layer 31 covers the entire upper area of the back cavity 11. After the first electrode layer 31 and the second electrode layer 33 are powered on, the piezoelectric structure 3 will be deformed, which will drive the piezoelectric section b of the suspended end 22 below the piezoelectric structure 3 to vibrate. The piezoelectric section b of the suspended end 22 drives the support section a of the suspended end 22 to vibrate, which drives the vibration of the support area of the integrated structure formed by the interconnection of the support sections. The support area is driven passively, so that the vibration of the support area is not limited by the deformation ability of the piezoelectric structure 3. It is beneficial to further improve the vibration effect of the diaphragm 2 and improve the acoustic performance of the MEMS piezoelectric speaker. Four slits 4 are arranged. One end of the slit 4 is connected to the accommodation space 24, and the other end has a certain distance from the inner perimeter of the substrate 1. At this time, the slit 4 is in the back cavity 11, which ensures that the adjacent support sections a of each suspended end 22 are connected to each other to form an integrated structure as the support area connecting the piezoelectric functional area and the substrate 1. The flexible film 6 is stacked on the side of the capacitive system away from the substrate 1, and the area of flexible film 6 corresponding to the piezoelectric layer 32 and the second electrode layer 33 toward the side of the capacitive system away from the substrate 1 protrudes to form a sunken cavity. The piezoelectric layer 32 and the second electrode layer 33 are located in the sunken cavity, which can not only ensure that the flexible film 6 can completely cover the piezoelectric structure 3 and the diaphragm 2, but also ensure that the flexible film 6 does not interfere with the deformation of the piezoelectric layer 32 and the second electrode layer 33. Preferably, all the first electrode layers 31 in each piezoelectric structure 3 are connected in an integrated configuration. The piezoelectric layer 32 and the second electrode layer 33 in each piezoelectric structure 3 are arranged independently. And the middle part of the flexible film 6 extends toward the substrate 1 to form a block part, and the block part extends into the middle space of the piezoelectric structure 3, which is beneficial to improve the acoustic performance of the MEMS piezoelectric speaker.

Figure 4:
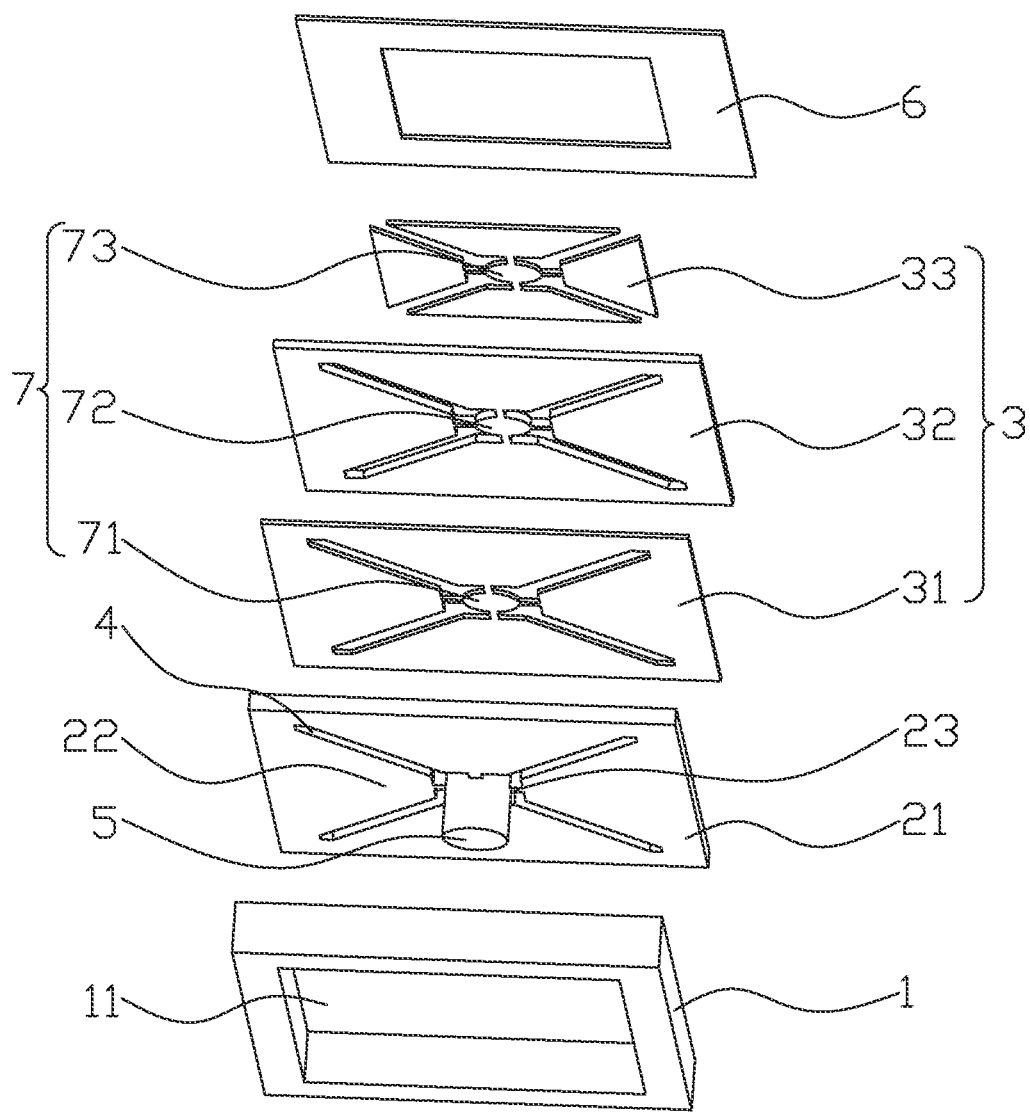
FIG. 4 is an exploded view of a MEMS piezoelectric speaker in accordance with a second embodiment of the present invention.
Figure 5:
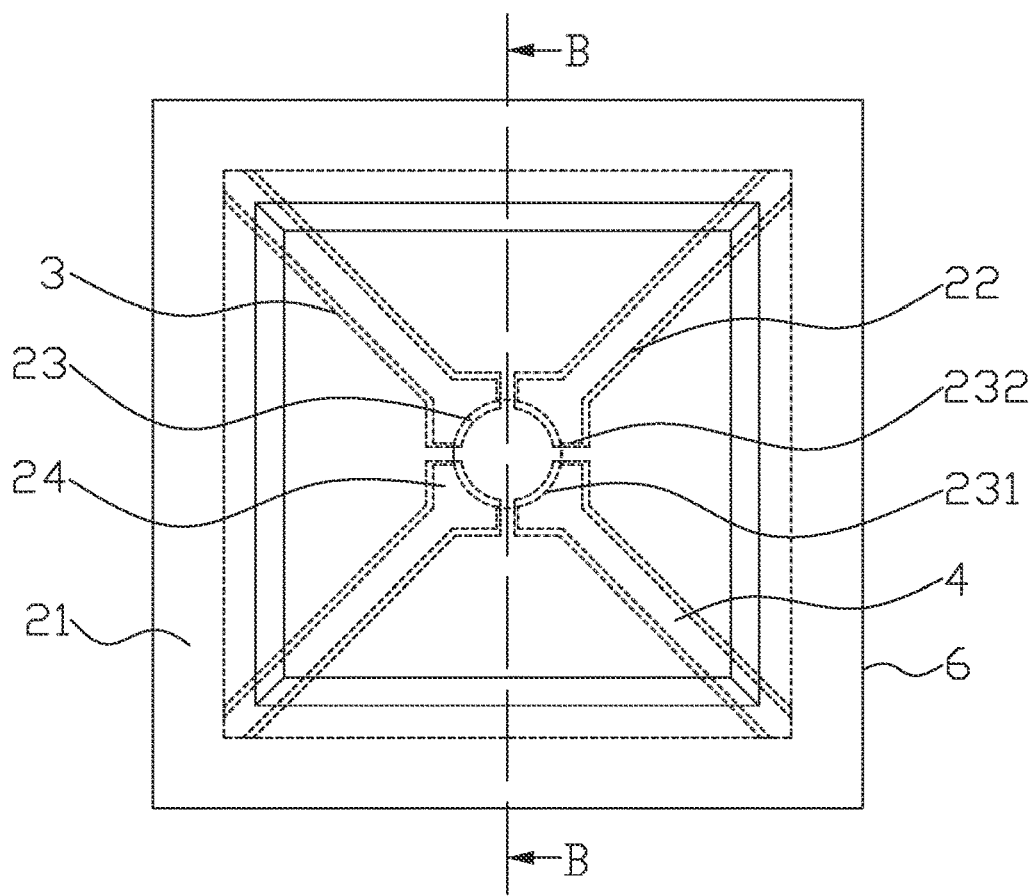
FIG. 5 is a top view of the MEMS piezoelectric speaker in FIG. 4.
Figure 6:
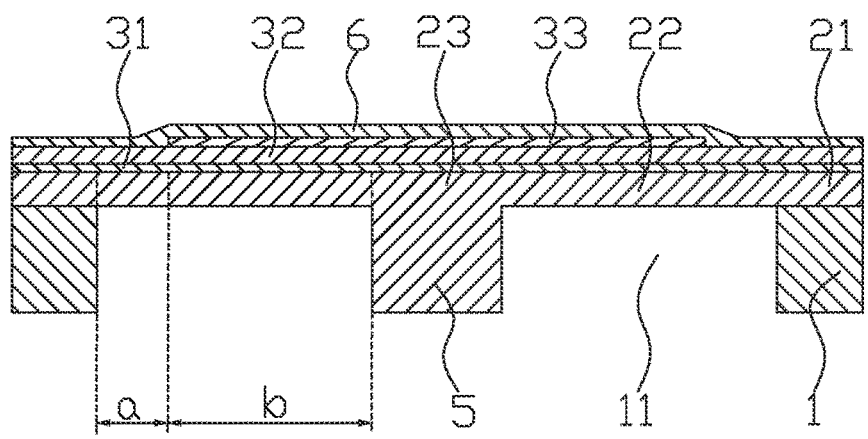
FIG. 6 is a cross-sectional view of the MEMS piezoelectric speaker taken along line BB in FIG. 5.

Referring to FIGS. 4-6, in the second embodiment, the projections of the first electrode layer 31 and the piezoelectric layer 32 along the thickness direction of the MEMS piezoelectric speaker both cover the fixed end 21 and the suspended end 22 of the diaphragm 2 at the same time. The slit 4 extends to the inner perimeter of substrate 1 and completely separates the adjacent suspended end 22. The flexible film 6 is provided on the side of the capacitive system away from the substrate 1, and the flexible film 6 covers the diaphragm 2 and the piezoelectric structure 3.

Specifically, the shapes and areas of the first electrode layer 31 and the piezoelectric layer 32 are the same as those of the diaphragm 2. The shapes and areas of the second electrode layer 33 are the same as those of the piezoelectric section b of the suspended end 22. At this time, the piezoelectric structure 3 is supported by the fixed end 21 of the diaphragm 2, which can improve the supporting strength provided by the diaphragm 2 to the piezoelectric structure 3. Thus, the vibration stability of the piezoelectric structure 3 is improved, thereby ensuring the vibration stability of the diaphragm 2. In addition, the slit 4 extends to the inner perimeter of the substrate 1 and completely separates adjacent suspended end 22. The first electrode layer 31, the piezoelectric layer 32, and the second electrode layer 33 in each piezoelectric structure 3 are connected in an integrated configuration. No rectangular block is set in the cavity of the flexible film 6. It should be understood that the remaining aspects of this embodiment are the same as the first embodiment, and will not be discussed here.

Figure 7:
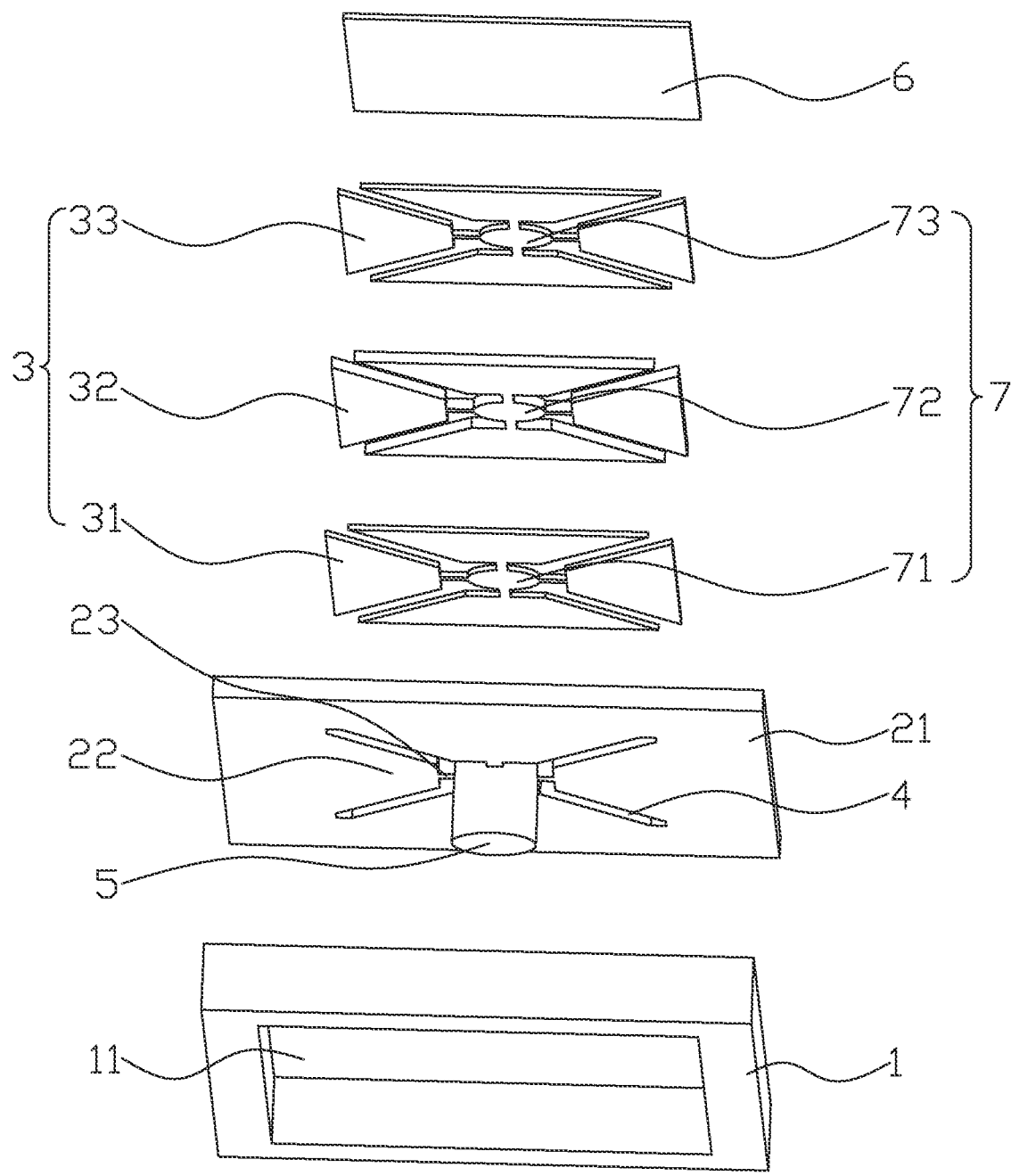
FIG. 7 is an exploded view of a MEMS piezoelectric speaker in accordance with a third embodiment of the present invention.
Figure 8:
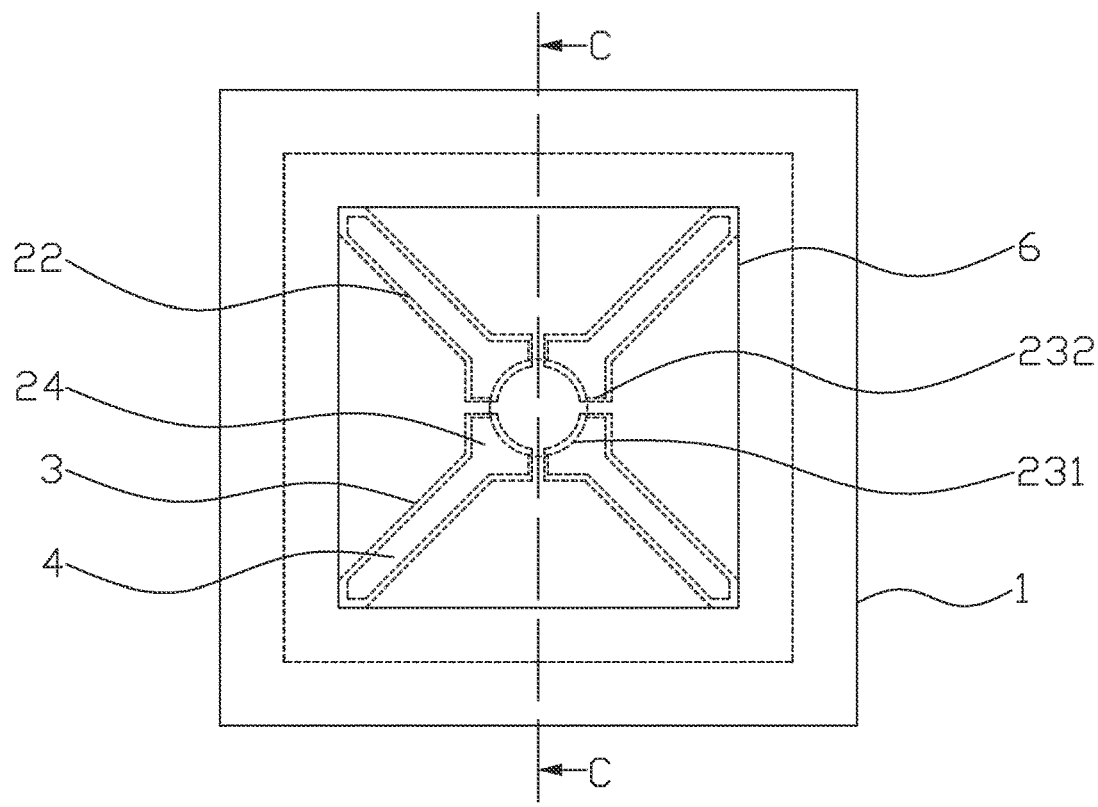
FIG. 8 is a top view of the MEMS piezoelectric speaker in FIG. 7.
Figure 9:
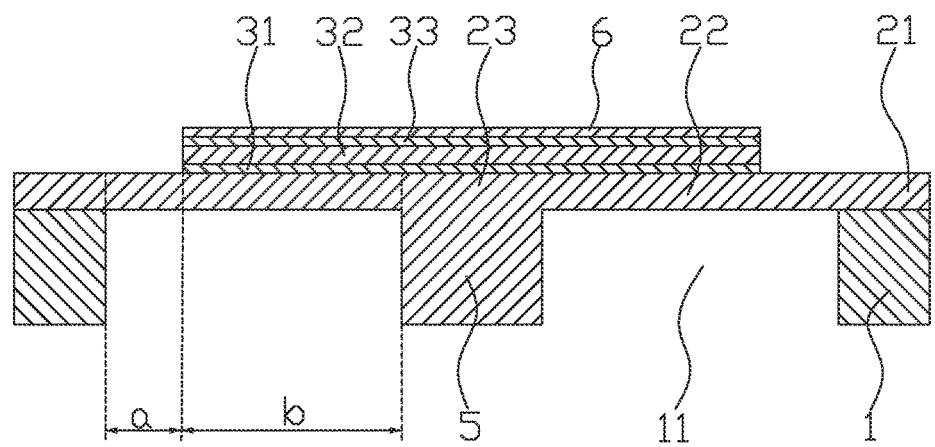
FIG. 9 is a cross-sectional view taken along line CC in FIG. 8.

Referring to FIGS. 7-9, in the third embodiment, the projections of the first electrode layer 31 and the piezoelectric layer 32 along the thickness direction of the MEMS piezoelectric speaker both cover only the piezoelectric section b of the diaphragm 2. The slit 4 is formed only between adjacent piezoelectric sections b. The adjacent support sections a of each suspended end 22 are connected to each other to form an integrated structure as a support area to connect the piezoelectric functional area and the substrate 1. The flexible film 6 is set on the side of the capacitive system away from the substrate 1, and the flexible film 6 only covers the piezoelectric section b, accommodation space 24 and slit 4 of the suspended end 22. It should be understood that the remaining aspects of this embodiment are the same as the second embodiment, and will not be discussed here.

In this embodiment, the main material of flexible film 6 is piezoelectric material, such as PZT (lead zirconate titanate piezoelectric ceramics), polymers (polyvinylidene fluoride and vinylidene fluoride-trifluoroethylene copolymer, etc.). The main materials of piezoelectric structure 3 are ALN (aluminum nitride), PZT (lead zirconate titanate piezoelectric ceramics) and ZNO (zinc oxide). The Young's Modulus of the flexible film 6 is smaller than that of the capacitive system, so that the flexible film 6 will not adversely affect the deformation of the piezoelectric structure 3. The flexible film 6 and the piezoelectric structure 3 are not on the same plane, so that the area of the piezoelectric functional area will not be limited by the flexible film 6, which is beneficial to increase the effective vibration area of the diaphragm 2 and improve the acoustic performance of the speaker. The flexible film 6 completely covers the slit 4, which can close the airflow, so that there is no air leakage area in the speaker, and the good acoustic performance of the speaker is ensured.

Referring FIGS. 2, 5 and 8, the connection end 23 includes a first connection element 231 connected to each suspended end 22. Each suspended end 22 is arranged around the first connection element 231. Specifically, the first connection element 231 may be a circular plate. The first connection element 231 is flush with the board surface of the suspended end 22. Since each suspended end 22 is connected to the first connection element 231, the vibration frequency of each suspended end 22 is consistent, which is beneficial to improve the vibration stability of the diaphragm 2. The first connection element 231 is located in the middle of the accommodation space 24, and each suspended end 22 is arranged around the first connection element 231 being a center at equal intervals. Each of the suspended end 22 is set symmetrically, and the distribution of the suspended end 22 in the back cavity 11 is more balanced, which is beneficial to improve the sound effect of the MEMS piezoelectric speaker.

According to actual needs, the shape of the connection end 23 can be a square, a hexagon, etc.; the first connection element 231 can be composed of a piezoelectric structure 3. It can be deformed according to the voltage applied to the area, or the piezoelectric structure 3 can be etched, not driven by the voltage, or formed of other materials.

Preferably, the connection end 23 further includes a second connection element 232 with one end connected to the suspended end 22 and the other end connected to the first connection element 231. At least one second connection element 232 is provided between each suspended end 22 and the first connection element 231. Specifically, the second connection element 232 may be a connection beam. The second connection element 232 can not only improve the connection strength between the first connection element 231 and the suspended end 22, but also enable a certain gap between the first connection element 231 and the suspended end 22.

The vibration amplitude reduction of each suspended end 22 is avoided after being connected to the first connection element 231. Based on the actual needs, the second connection elements 232 between each of the suspended end 22 and the first connection element 231 can be set to be multiple, such as two or three. By designing the shape and size of the second connection element 232 reasonably, such as a u-shaped beam or an s-shaped beam, the THD (total harmonic distortion) of the device is effectively reduced, and the acoustic performance and reliability of MEMS piezoelectric speaker are improved.

The MEMS piezoelectric speaker also includes a weight 5 fixed to the first connection element 231 and housed in the back cavity 11. The weight can reduce the resonant frequency of the MEMS piezoelectric speaker and flexibly adjust the first resonant frequency of the MEMS piezoelectric speaker. The available vocal frequency range is increased and the THD of the device is decreased. Preferably, the material of weight 5 is the same as that of the substrate 1. According to actual needs, the shape of the weight 5 can be a ring, a frame, and other polygons.

Referring to FIGS. 4 and 7, the MEMS piezoelectric speaker also includes a connection assembly 7 fixed to the side of the connection end 23 away from the substrate 1. The connection assembly 7 includes a number of sub-connection elements stacked in sequence along the thickness direction of the MEMS piezoelectric speaker. The sub-connection element includes a first sub-connection element 71 connecting the first electrode layers 31 of a number of the piezoelectric structures 3, a second sub-connection element 72 connecting the piezoelectric layer 32, and a third sub-connection element 73 connecting the second electrode layer 33.

Specifically, the shape and area of the first sub-connection element 71, the second sub-connection element 72 and the third sub-connection element 73 are the same as the shape and area of the connection end 23, which ensures that the first electrode layer 31 can tightly attached onto the diaphragm 2. The piezoelectric layer 32 is tightly attached to the first electrode layer 31, and the second electrode layer 33 is tightly attached to the piezoelectric layer 32. As an embodiment, the first sub-connection element 71 and the first electrode layer 31 are integrated. The second sub-connection element 72 and the piezoelectric layer 32 are integrated, and the third sub-connection element 73 and the second electrode layer 33 are integrated, which reduces the number of processing steps.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS piezoelectric speaker including:
   a substrate with a back cavity;
   a diaphragm fixed to the substrate, having a fixed end fixed to the substrate, a plurality of suspended ends extending from the fixed end and suspended above the back cavity; a slit being formed between two adjacent suspended ends;
   an accommodation space communicating with the slit being formed by spaced ends of the plurality of suspended ends away from the fixed end;
   a capacitive system fixed to a side of the diaphragm away from the substrate; wherein
   the suspended end includes a support section connected to the fixed end and a piezoelectric section connected to the support section away from the fixed end;
   the capacitive system includes a plurality of piezoelectric structures corresponding to the suspended end;
   each of the piezoelectric structures includes a first electrode layer, a piezoelectric layer and a second electrode layer that is stacked in order on the diaphragm and at least completely covers the piezoelectric section;
   a projection of the second electrode layer along a thickness direction of the MEMS piezoelectric speaker covers only the piezoelectric section of the diaphragm;
   an overlapping portion of the first electrode layer and the piezoelectric layer and the second electrode layer along the thickness direction of the MEMS piezoelectric speaker together form a piezoelectric functional area;
   the MEMS piezoelectric speaker further includes a flexible film locating on a side of the capacitive system away from the back cavity and at least completely covering the slit; the flexible film is located on a different plane from the diaphragm; the flexible film is at least partially spaced from the diaphragm along the thickness direction of the MEMS piezoelectric speaker and the flexible film is spaced from the substrate.

2. The MEMS piezoelectric speaker as described in claim 1, wherein the projections of the first electrode layer and the piezoelectric layer along the thickness direction of the MEMS piezoelectric speaker both cover only the piezoelectric section of the diaphragm; or the projections of the first electrode layer and the piezoelectric layer along the thickness direction of the MEMS piezoelectric speaker both cover the fixed end and the suspended end of the diaphragm at the same time; or the projection of the first electrode layer along the thickness direction of the MEMS piezoelectric speaker covers the fixed end and the suspended end of the diaphragm; the projections of the piezoelectric layer and the second electrode layer along the thickness direction of the MEMS piezoelectric speaker covers only the piezoelectric section of the diaphragm.

3. The MEMS piezoelectric speaker as described in claim 2, wherein, when the projection of the piezoelectric layer along the thickness direction of the MEMS piezoelectric speaker covers only the piezoelectric section of the diaphragm, the slit is only formed between the adjacent piezoelectric sections; the adjacent support sections of the suspended ends are connected to each other to form an integrated structure which acts as a support area to connect the piezoelectric functional area and the substrate.

4. The MEMS piezoelectric speaker as described in claim 2, wherein, when the projections of the first electrode layer and the piezoelectric layer along the thickness direction of the MEMS piezoelectric speaker both cover the fixed end and the suspended end of the diaphragm at the same time, the slit extends to the inner perimeter of the substrate and completely separates the adjacent suspended ends.

5. The MEMS piezoelectric speaker as described in claim 1, wherein the diaphragm further includes a connection end connecting each of the suspended ends; the connection end is accommodated in the accommodation space; the connection end includes a first connection element connected to each of the suspended ends; each of the suspended ends is arranged around the first connection element.

6. The MEMS piezoelectric speaker as described in claim 5, wherein the connection end further includes a second connection element with one end connected to the suspended end and the other end connected to the first connection element; at least one second connection element is arranged between each of the suspended end and the first connection element.

7. The MEMS piezoelectric speaker as described in claim 5 further including a weight fixed to the first connection element and accommodated in the back cavity.

8. The MEMS piezoelectric speaker according to claim 1, wherein the Young's Modulus of the flexible film is smaller than the Young's Modulus of the diaphragm.

9. The MEMS piezoelectric speaker as described in claim 5, further including a connection assembly fixed to a side of the connection end away from the substrate; the connection assembly includes a plurality of sub-connection elements stacked in sequence along the thickness direction of the MEMS piezoelectric speaker; the sub-connection element includes a first sub-connection element connecting the first electrode layers of a plurality of the piezoelectric structure, a second sub-connection element connected to piezoelectric layer, and a third sub-connection element connected to the second electrode layer.

10. The MEMS piezoelectric speaker as described in claim 9, wherein the first sub-connection element and the first electrode layer are integrated; the second sub-connection element and the piezoelectric layer are integrated; the third sub-connection element and the second electrode layer are integrated.

* * * * *